United States Patent
Han et al.

(10) Patent No.: US 10,181,505 B2
(45) Date of Patent: Jan. 15, 2019

(54) ACTIVE MATRIX ORGANIC LIGHT EMITTING DIODE DISPLAY PANEL STRUCTURE

(71) Applicant: Shenzhen China Star Optoelectronics Semiconductor Display Technology Co., Ltd., Shenzhen (CN)

(72) Inventors: Baixiang Han, Shenzhen (CN); Yuanchun Wu, Shenzhen (CN); Poyen Lu, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/570,366

(22) PCT Filed: Jul. 13, 2017

(86) PCT No.: PCT/CN2017/092867
§ 371 (c)(1),
(2) Date: Oct. 30, 2017

(65) Prior Publication Data
US 2018/0358422 A1  Dec. 13, 2018

(30) Foreign Application Priority Data
Jun. 8, 2017  (CN) .......................... 2017 1 0429361

(51) Int. Cl.
G09G 3/3225 (2016.01)
H01L 27/32 (2006.01)
H01L 27/12 (2006.01)

(52) U.S. Cl.
CPC ...... *H01L 27/3276* (2013.01); *H01L 27/3262* (2013.01); *H01L 27/124* (2013.01)

(58) Field of Classification Search
CPC .. H01L 51/50; H01L 27/3276; H01L 27/3262
(Continued)

(56) References Cited

U.S. PATENT DOCUMENTS 9,370,669 B2   6/2016 Park et al.
2012/0107978 A1*  5/2012 Shin ...................... H01L 51/003
                                                           438/29
(Continued)

FOREIGN PATENT DOCUMENTS

CN   102346999 A   2/2012
CN   104134424 A   11/2014
(Continued)

*Primary Examiner* — Long K Tran
(74) *Attorney, Agent, or Firm* — Leong C. Lei (57) ABSTRACT

Disclosed is an AMOLED display panel structure, comprising a plurality of transversely scan lines which extend horizontally, a plurality of data lines which extend vertically and are insulated from the scan lines, switching lines of a same number of the scan lines which extend vertically, a plurality of row driving circuits coupled to the switching lines and a plurality of column driving circuits coupled to the data lines; one switching line is coupled to one scan line, one row driving circuit is coupled to a plurality of switching lines, one column driving circuits is coupled to a plurality of data lines; the row driving circuit and the column driving circuit are located in the lower border frame region; the left, right and upper frame regions are only used for package to achieve the ultra narrow border frames for all three sides of the AMOLED display panel.

14 Claims, 6 Drawing Sheets

(58) Field of Classification Search
USPC .................................... 257/40; 438/82, 99
See application file for complete search history.

(56) References Cited

U.S. PATENT DOCUMENTS

2017/0365808 A1* 12/2017 Lee .................. H01L 51/5228
2018/0090553 A1* 3/2018 Rieutort-Louis ... H01L 27/3218

FOREIGN PATENT DOCUMENTS

| CN | 104157239 A | 11/2014 |
| CN | 204102098 U | 1/2015 |
| JP | 2003280585 A | 10/2003 |

* cited by examiner

ACTIVE MATRIX ORGANIC LIGHT EMITTING DIODE DISPLAY PANEL STRUCTURE

FIELD OF THE INVENTION

The present invention relates to an organic light emitting diode display field, and more particularly to an active matrix organic light emitting diode display panel structure.

BACKGROUND OF THE INVENTION

In the display field, the Liquid Crystal Display (LCD) and the Organic Light Emitting Diode (OLED) has been gradually replaced the Cathode Ray Tube (CRT) display. The OLED display panel possesses many outstanding properties of self-illumination, low driving voltage, high luminescence efficiency, fast response, high clarity and contrast, near 180° view angle, wide range of working temperature, applicability of flexible display and large scale full color display and is widely used in mobile phones, tablet PCs and full color televisions.

The OLED display panel can be categorized into two major types according to the driving methods, which are the Passive Matrix (PM) type and the Active Matrix (AM) type, i.e. the direct addressing and the Thin Film Transistor (TFT) matrix addressing.

Figure 1:
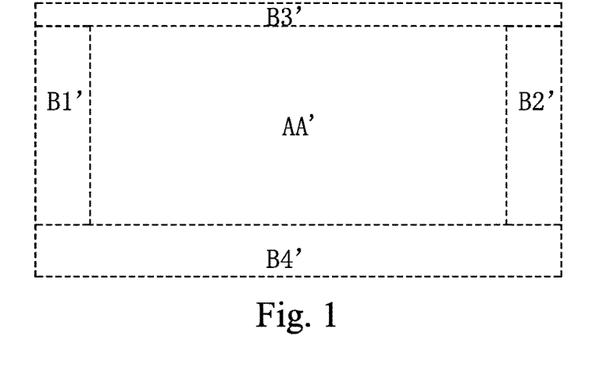
FIG. 1 is a front view diagram of an active matrix organic light emitting diode display panel according to prior art.
Figure 2:
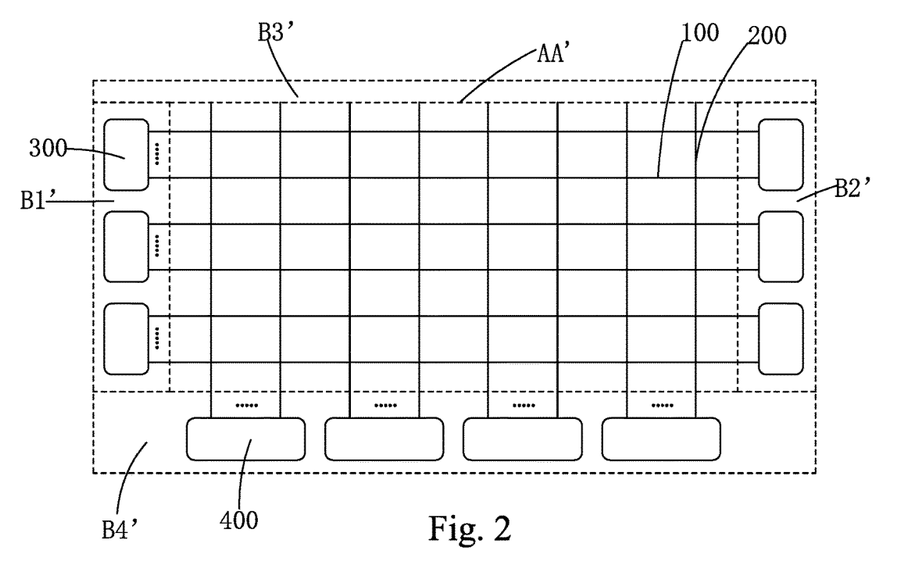
FIG. 2 is an internal circuit diagram of an active matrix organic light emitting diode display panel according to prior art.

FIG. 1 is a front view diagram of an active matrix organic light emitting diode display panel according to prior art. FIG. 2 is an internal circuit diagram of an active matrix organic light emitting diode display panel according to prior art. As shown in FIG. 1 and FIG. 2, the AMOLED display panel according to prior art comprises a display area AA' and a left border frame region a right border frame region B2', an upper border frame region B3' and a lower border frame region B4' surrounding a periphery of the display area AA'.

The display area AA' comprises a plurality of scan lines 100 which extend horizontally and a plurality of data lines 200 which extend vertically and are insulated from the scan lines 100. The upper border frame region B3' is merely used for package; the left border frame region B1' and the right border frame region B2' are not only used for package but also used for arrangement for a plurality of row driving ICs 300 which are coupled to the scan lines 100 and input scan signals to the scan lines 100; the lower border frame region B4' is not only used for package but also used for arrangement for a plurality of column driving ICs 400 which are coupled to the data lines 200 and input data signals to the data lines 200; therefore, the widths of the the left border frame region the right border frame region B2' and the lower border frame region B4' are larger.

With the constant development of display technology, the demands of the users to the ultra narrow frame display panel will become more and more intense. Thus, it is necessary to improve the aforesaid existing AMOLED display panel.

SUMMARY OF THE INVENTION

An objective of the present invention is to provide an active matrix organic light emitting diode display panel structure, in which all of the upper border frame region, the left border frame region and the right border frame region are ultra narrow border frames to realize the almost borderless state of the active matrix organic light emitting diode display panel in three sides in comparison with prior art that only can reduce widths of left border frame region and right border frame region of the active matrix organic light emitting diode display panel.

For realizing the aforesaid objective, the present invention provides an active matrix organic light emitting diode display panel structure, comprising a first metal layer, a second metal layer, a third metal layer, a plurality of row driving circuits and a plurality of column driving circuits;

wherein the second metal layer comprises a plurality of scan lines which extend horizontally, the third metal layer comprises a plurality of data lines which extend vertically and are insulated from the scan lines, the first metal layer comprises switching lines of a same number of the scan lines which extend vertically;

one switching line is correspondingly coupled to one scan line, one of the row driving circuits is correspondingly coupled to a plurality of switching lines, one of the column driving circuits is correspondingly coupled to a plurality of data lines;

wherein the active matrix organic light emitting diode display panel structure comprises a display area and a left border frame region, a right border frame region, an upper border frame region and a lower border frame region surrounding a periphery of the display area; the row driving circuits and the column driving circuits are located in the lower border frame region; the left border frame region, the right border frame region and the upper border frame region are only used for package.

The first metal layer further comprises a power supply line, the second metal layer further comprises a first conductor line connecting the power supply line and the third metal layer further comprises a second conductor line connecting the first conductor line.

Optionally, one of the row driving circuits is individually packaged inside one row driving chip and one of the column driving circuits is individually packaged inside one column driving chip.

Optionally, one of the row driving circuits and one of the column driving circuits are integrally packaged inside one integrated driving chip.

A buffer layer is arranged between the scan line and the switching line, one scan line is electrically coupled to one switching line through a first through hole penetrating the buffer layer.

Thin film package is used in the left border frame region, the right border frame region and the upper border frame region.

The active matrix organic light emitting diode display panel structure further comprises a substrate, a gate integrated with the scan line, a gate insulation layer, an active layer, an etching stopper layer, a source integrated with the data line and a drain located at a same layer with the data line;

wherein the switching line and the power supply line are arranged on the substrate, the buffer layer covers the substrate, the switching line and the power supply line, the scan line and the first conductor line are arranged on the buffer layer, the gate insulation layer covers the buffer layer, the scan line, the gate integrated with the scan line and the first conductor line, the active layer is arranged on the gate insulation layer, the etching stopper layer covers the active layer and the gate insulation layer, all of the data line, the source integrated with the data line, the drain and the second conductor line are arranged on the etching stopper layer;

wherein the first conductor line contacts the power supply line via a second through hole penetrating the buffer layer; the source integrated with the data line and the drain respectively contact two sides of the active layer via a third through hole and a fourth through hole penetrating the etching stopper layer; the second conductor line contacts with the first conductor line via a fifth through hole penetrating the etching stopper layer and the gate insulation layer.

Materials of the switching line, the power supply line, the scan line, the gate integrated with the scan line, the first conductor line, the data line, the source integrated with the data line, the drain and the second conductor line are a stack combination of one or more of molybdenum, titanium, aluminum and copper.

Materials of the buffer layer, the gate insulation layer and the etching stopper layer are silicon oxide, silicon nitride or a combination of the two; the substrate is a glass substrate.

Materials of the buffer layer, the gate insulation layer and the etching stopper layer are silicon oxide, silicon nitride or a combination of the two; the substrate is a glass substrate.

wherein the second metal layer comprises a plurality of scan lines which extend horizontally, the third metal layer comprises a plurality of data lines which extend vertically and are insulated from the scan lines, the first metal layer comprises switching lines of a same number of the scan lines which extend vertically; one switching line is correspondingly coupled to one scan line, one of the row driving circuits is correspondingly coupled to a plurality of switching lines, one of the column driving circuits is correspondingly coupled to a plurality of data lines;

wherein the active matrix organic light emitting diode display panel structure comprises a display area and a left border frame region, a right border frame region, an upper border frame region and a lower border frame region surrounding a periphery of the display area; the row driving circuits and the column driving circuits are located in the lower border frame region; the left border frame region, the right border frame region and the upper border frame region are only used for package;

wherein the first metal layer further comprises a power supply line, the second metal layer further comprises a first conductor line connecting the power supply line and the third metal layer further comprises a second conductor line connecting the first conductor line;

wherein a buffer layer is arranged between the scan line and the switching line, one scan line is electrically coupled to one switching line through a first through hole penetrating the buffer layer;

wherein thin film package is used in the left border frame region, the right border frame region and the upper border frame region;

wherein the active matrix organic light emitting diode display panel structure further comprises a substrate, a gate integrated with the scan line, a gate insulation layer, an active layer, an etching stopper layer, a source integrated with the data line and a drain located at a same layer with the data line;

wherein the switching line and the power supply line are arranged on the substrate, the buffer layer covers the substrate, the switching line and the power supply line, the scan line and the first conductor line are arranged on the buffer layer, the gate insulation layer covers the buffer layer, the scan line, the gate integrated with the scan line and the first conductor line, the active layer is arranged on the gate insulation layer, the etching stopper layer covers the active layer and the gate insulation layer, all of the data line, the source integrated with the data line, the drain and the second conductor line are arranged on the etching stopper layer;

wherein the first conductor line contacts the power supply line via a second through hole penetrating the buffer layer; the source integrated with the data line and the drain respectively contact two sides of the active layer via a third through hole and a fourth through hole penetrating the etching stopper layer; the second conductor line contacts with the first conductor line via a fifth through hole penetrating the etching stopper layer and the gate insulation layer.

The benefits of the present invention are: the present invention provides an active matrix organic light emitting diode display panel structure comprises switching lines of a same number of the scan lines which extend vertically and correspondingly coupled to one scan line which extend horizontally to switch the scan line to the row driving circuit. Thus, the row driving circuit can be located in the lower border frame region as the column driving circuit. The left border frame region, the right border frame region and the upper border frame region are only used for package. All of the upper border frame region, the left border frame region and the right border frame region are ultra narrow border frames to realize the almost borderless state of the active matrix organic light emitting diode display panel in three sides in comparison with prior art that only can reduce widths of left border frame region and right border frame region of the active matrix organic light emitting diode display panel.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Please refer to FIG. 3, FIG. 4, FIG. 6 and FIG. 7, together or refer to FIG. 3, FIG. 5, FIG. 6 and FIG. 7, together. The present invention provides an active matrix organic light emitting diode display panel structure, comprising a first metal layer M1, a second metal layer M2, a third metal layer M3, a plurality of row driving circuits 91 and a plurality of column driving circuits 92.

The second metal layer M2 comprises a plurality of transversely scan lines 11 which extend horizontally, the third metal layer M3 comprises a plurality of data lines 21 which extend vertically and are insulated from the scan lines 11, the first metal layer M1 comprises switching lines 31 of a same number of the scan lines 11 which extend vertically. One switching line 31 is correspondingly coupled to one scan line 11, one of the row driving circuits 91 is correspondingly coupled to a plurality of switching lines 31, one of the column driving circuits 92 is correspondingly coupled to a plurality of data lines 21.

Figure 3:
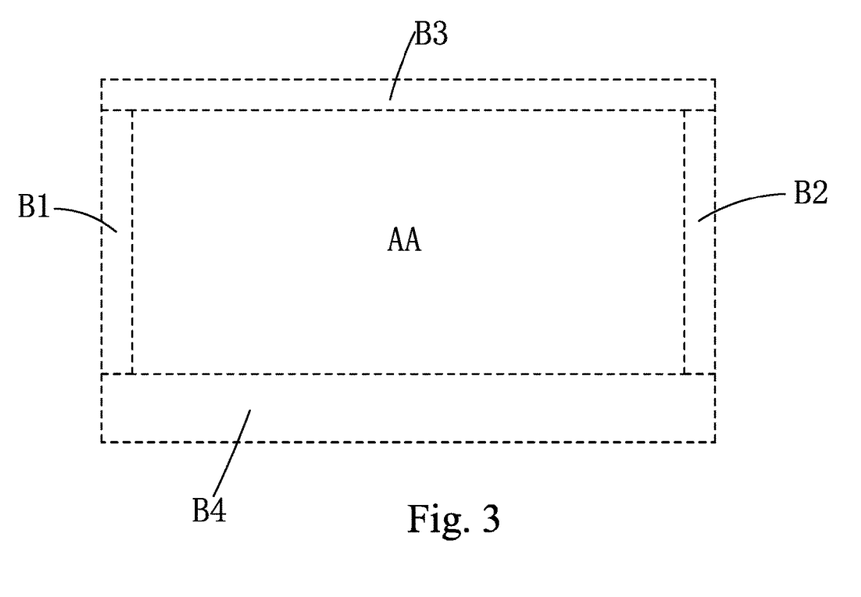
FIG. 3 is a front view diagram of an active matrix organic light emitting diode display panel structure according to the present invention.
Figure 4:
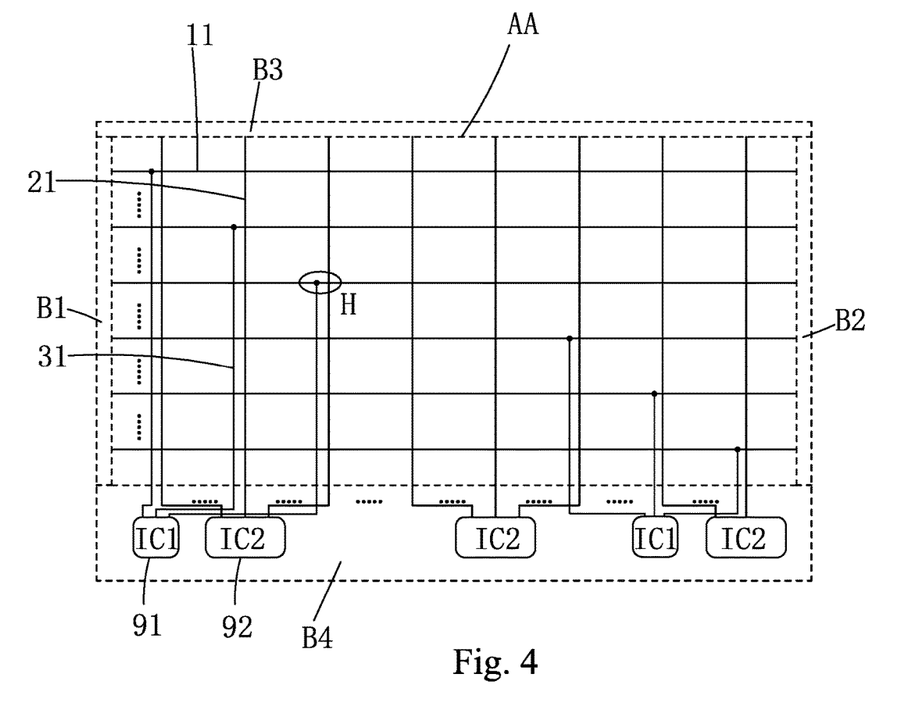
FIG. 4 is a diagram of the first embodiment of an internal circuit of an active matrix organic light emitting diode display panel structure according to the present invention.
Figure 5:
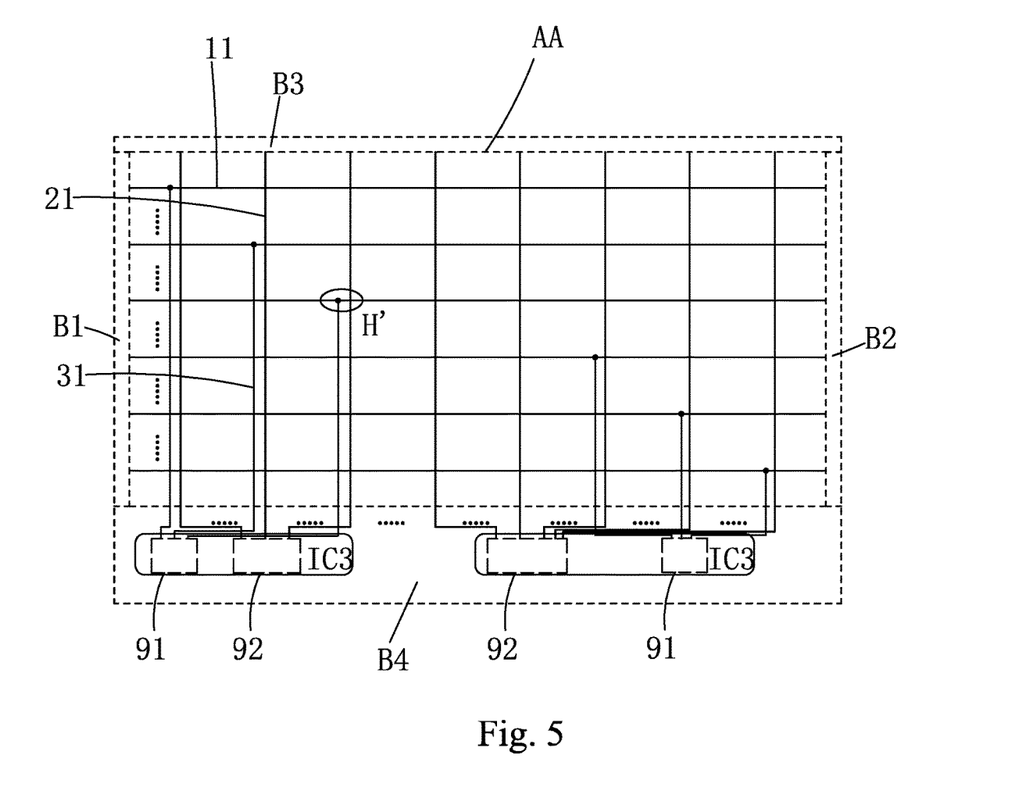
FIG. 5 is a diagram of the second embodiment of an internal circuit of an active matrix organic light emitting diode display panel structure according to the present invention.
Figure 6:
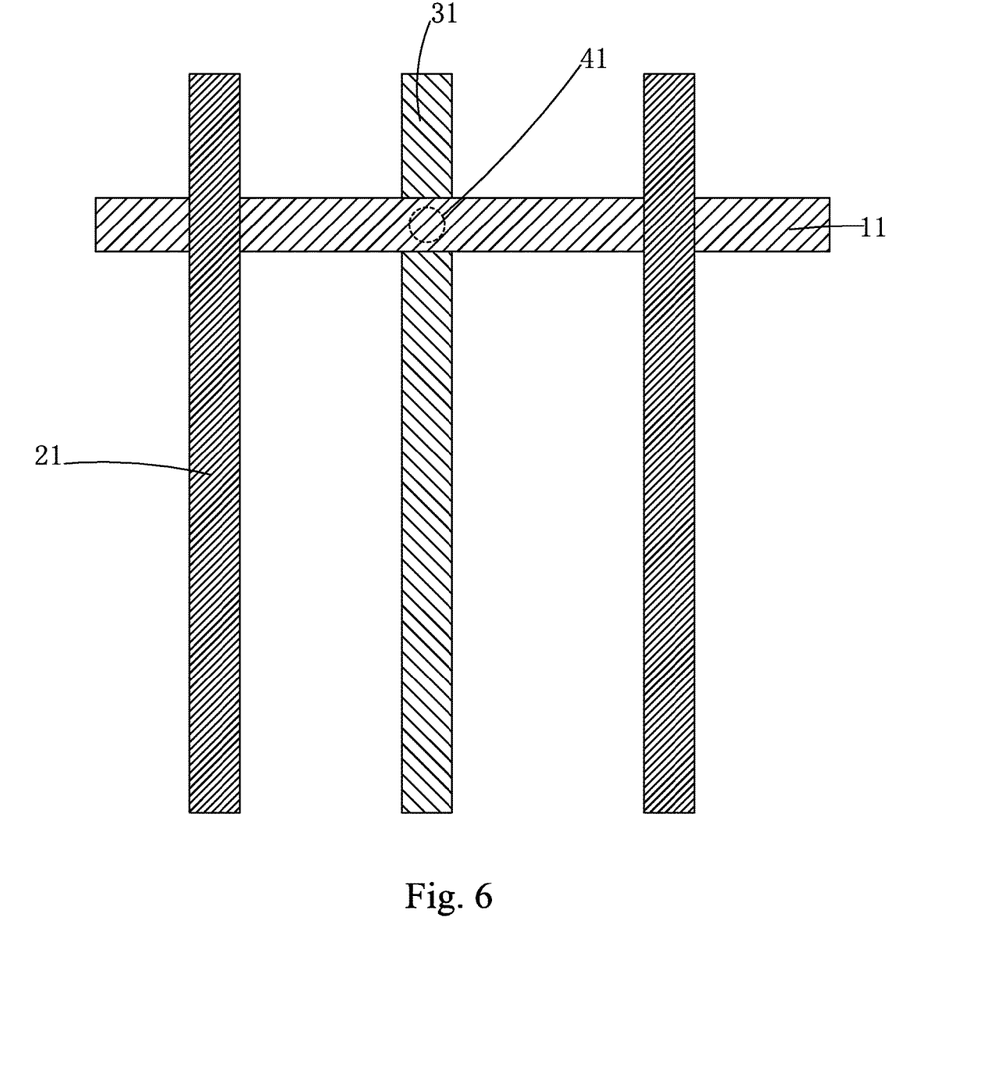
FIG. 6 is an enlarged diagram corresponding to the H position at FIG. 4 or the H' position in FIG. 5.

The active matrix organic light emitting diode display panel structure comprises a display area AA and a left border frame region B1, a right border frame region B2, an upper border frame region B3 and a lower border frame region B4 surrounding a periphery of the display area AA. The row driving circuits 91 and the column driving circuits 92 are located in the lower border frame region B4. The row driving circuit 91 inputs a scan signal to the switching line 31. The switching line 31 transmits the scan signal and transfers the same to the scan line 11; the column driving circuit 92 inputs a data signal to the data line 21. The active matrix organic light emitting diode display panel performs display under the control of the scan signal and the data signal.

In comparison with prior art that the row driving circuit is arranged in the left border frame region and right border frame region of the active matrix organic light emitting diode display panel, the active matrix organic light emitting diode display panel structure of the present invention comprises switching lines 31 of the same number of the scan lines 11 which extend vertically and correspondingly coupled to one scan line 11 which extend horizontally to switch the scan line 11 to the row driving circuit 91. Without occupying the original layout arrangement space, the row driving circuit 91 can be located in the lower border frame region B4 as the column driving circuit 92. Thus, the left border frame region B1, the right border frame region B2 and the upper border frame region B3 can be only used for package. All of the left border frame region B1, the right border frame region B2 and the upper border frame region B3 are ultra narrow border frames to realize the almost borderless state of the AMOLED display panel in three sides in comparison with prior art that only can reduce the widths of left border frame region and right border frame region of the AMOLED display panel.

Furthermore, thin film package is used in the left border frame region B1, the right border frame region B2 and the upper border frame region B3 to ensure that the widths of the left border frame region B1, the right border frame region B2 and the upper border frame region B3 are narrow enough.

Optionally, as shown in FIG. 4, one of the row driving circuits 91 is individually packaged inside one row driving chip IC1 and one of the column driving circuits 92 is individually packaged inside one column driving chip IC2. Alternatively, as shown in FIG. 5, one of the row driving circuits 91 and one of the column driving circuits 92 are integrally packaged inside one integrated driving chip IC3.

Figure 7:
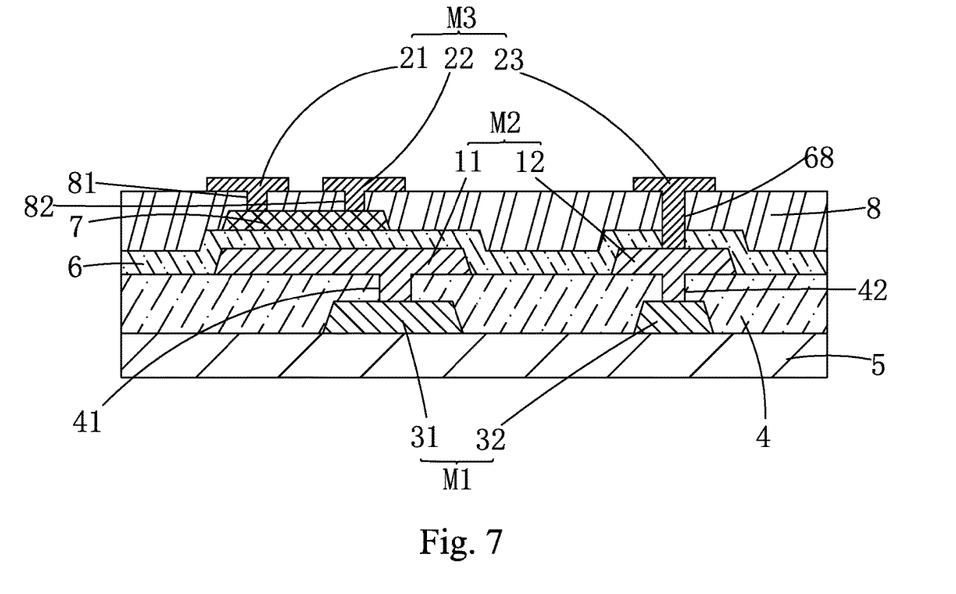
FIG. 7 is a sectional diagram of an active matrix organic light emitting diode display panel structure according to the present invention.

Specifically, the scan line 11 and the switching line 31 may be in different layers as shown in FIG. 7 but are not limited to. A buffer layer 4 is arranged between the scan line 11 and the switching line 31, one scan line 11 is electrically coupled to one switching line 31 through a first through hole 41 penetrating the buffer layer 4.

Furthermore, the first metal layer M1 further comprises a power supply line 32, the second metal layer M2 further comprises a first conductor line 12 connecting the power supply line 32 and the third metal layer M3 further comprises a second conductor line 23 connecting the first conductor line 12. Compared with prior art in which the power supply line is arranged at a layer different from the metal layer where the data line is, the present invention can arrange the power supply line 32 in the first metal layer M1 for the layout of the physical lines of VDD and VSS and can save the pixel layout space.

Still, FIG. 7 is illustrated. In one preferred embodiment of the present invention, the active matrix organic light emitting diode display panel structure further comprises a substrate 5, a gate integrated with the scan line 11, a gate insulation layer 6, an active layer 7, an etching stopper layer 8, a source integrated with the data line 21 and a drain 22 located at a same layer with the data line 21.

The switching line 31 and the power supply line 32 are arranged on the substrate 5, the buffer layer 4 covers the substrate 5, the switching line 31 and the power supply line 32, the scan line 32 and the first conductor line 12 are arranged on the buffer layer 4, the gate insulation layer 6 covers the buffer layer 4, the scan line 11, the gate integrated with the scan line 11 and the first conductor line 12, the active layer 7 is arranged on the gate insulation layer 6, the etching stopper layer 8 covers the active layer 7 and the gate insulation layer 6, all of the data line 21, the source integrated with the data line 21, the drain 22 and the second conductor line 23 are arranged on the etching stopper layer 8. The first conductor line 12 contacts the power supply line 32 via a second through hole 42 penetrating the buffer layer 4; the source integrated with the data line 21 and the drain 22 respectively contact two sides of the active layer 7 via a third through hole 81 and a fourth through hole 82 penetrating the etching stopper layer 8; the second conductor line 23 contacts with the first conductor line 12 via a fifth through hole 68 penetrating the etching stopper layer 8 and the gate insulation layer 6. The gate integrated with the scan line 11, the gate insulation layer 6, the active layer 7, the etching stopper layer 8, the source integrated with the data line 21 and the drain 22 constitute an etching stopper (ESL) Type TFT. Certainly, in other embodiments of the present invention, TFTs may also employ TFT structures of other types, which are commonly used in prior art, which do not affect the implementation of the present invention.

Furthermore, the substrate 5 is preferably to be a glass substrate; materials of the switching line 31, the power supply line 32, the scan line 11, the gate integrated with the scan line 11, the first conductor line 12, the data line 21, the source integrated with the data line 21, the drain 22 and the second conductor line 23 are a stack combination of one or more of molybdenum (Mo), titanium (Ti), aluminum (Al) and copper (Cu); materials of the buffer layer 4, the gate insulation layer 6 and the etching stopper layer 8 are silicon oxide (SiOx), silicon nitride (SiNx) or a combination of the two.

The AMOLED display panel structure of the present invention is particularly suitable for high resolution top emission type AMOLED display panels with ultra narrow borders and can also be applied to low resolution bottom emission type AMOLED display panels for ultra narrow borders.

In conclusion, the active matrix organic light emitting diode display panel structure of the present invention comprises switching lines of a same number of the scan lines which extend vertically and correspondingly coupled to one scan line which extend horizontally to switch the scan line to the row driving circuit. Thus, the row driving circuit can be located in the lower border frame region as the column driving circuit. The left border frame region, the right border frame region and the upper border frame region are only used for package. All of the upper border frame region, the left border frame region and the right border frame region are ultra narrow border frames to realize the almost borderless state of the active matrix organic light emitting diode display panel in three sides in comparison with prior art that only can reduce widths of left border frame region and right border frame region of the active matrix organic light emitting diode display panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An active matrix organic light emitting diode display panel structure, comprising a first metal layer, a second metal layer, a third metal layer, a plurality of row driving circuits and a plurality of column driving circuits;
    wherein the second metal layer comprises a plurality of scan lines which extend horizontally, the third metal layer comprises a plurality of data lines which extend vertically and are insulated from the scan lines, the first metal layer comprises switching lines of a same number of the scan lines which extend vertically; one switching line is correspondingly coupled to one scan line, one of the row driving circuits is correspondingly coupled to a plurality of switching lines, one of the column driving circuits is correspondingly coupled to a plurality of data lines;
    wherein the active matrix organic light emitting diode display panel structure comprises a display area and a left border frame region, a right border frame region, an upper border frame region and a lower border frame region surrounding a periphery of the display area; the row driving circuits and the column driving circuits are located in the lower border frame region; the left border frame region, the right border frame region and the upper border frame region are only used for package.

2. The active matrix organic light emitting diode display panel structure according to claim 1, wherein the first metal layer further comprises a power supply line, the second metal layer further comprises a first conductor line connecting the power supply line and the third metal layer further comprises a second conductor line connecting the first conductor line.

3. The active matrix organic light emitting diode display panel structure according to claim 1, wherein one of the row driving circuits is individually packaged inside one row driving chip and one of the column driving circuits is individually packaged inside one column driving chip.

4. The active matrix organic light emitting diode display panel structure according to claim 1, wherein one of the row driving circuits and one of the column driving circuits are integrally packaged inside one integrated driving chip.

5. The active matrix organic light emitting diode display panel structure according to claim 2, wherein a buffer layer is arranged between the scan line and the switching line, one scan line is electrically coupled to one switching line through a first through hole penetrating the buffer layer.

6. The active matrix organic light emitting diode display panel structure according to claim 1, wherein thin film package is used in the left border frame region, the right border frame region and the upper border frame region.

7. The active matrix organic light emitting diode display panel structure according to claim 5, further comprising a substrate, a gate integrated with the scan line, a gate insulation layer, an active layer, an etching stopper layer, a source integrated with the data line and a drain located at a same layer with the data line;
    wherein the switching line and the power supply line are arranged on the substrate, the buffer layer covers the substrate, the switching line and the power supply line, the scan line and the first conductor line are arranged on the buffer layer, the gate insulation layer covers the buffer layer, the scan line, the gate integrated with the scan line and the first conductor line, the active layer is arranged on the gate insulation layer, the etching stopper layer covers the active layer and the gate insulation layer, all of the data line, the source integrated with the data line, the drain and the second conductor line are arranged on the etching stopper layer;
    wherein the first conductor line contacts the power supply line via a second through hole penetrating the buffer layer; the source integrated with the data line and the drain respectively contact two sides of the active layer via a third through hole and a fourth through hole penetrating the etching stopper layer; the second conductor line contacts with the first conductor line via a fifth through hole penetrating the etching stopper layer and the gate insulation layer.

8. The active matrix organic light emitting diode display panel structure according to claim 7, wherein materials of the switching line, the power supply line, the scan line, the gate integrated with the scan line, the first conductor line, the data line, the source integrated with the data line, the drain and the second conductor line are a stack combination of one or more of molybdenum, titanium, aluminum and copper.

9. The active matrix organic light emitting diode display panel structure according to claim 7, wherein materials of the buffer layer, the gate insulation layer and the etching stopper layer are silicon oxide, silicon nitride or a combination of the two; the substrate is a glass substrate.

10. An active matrix organic light emitting diode display panel structure, comprising a first metal layer, a second metal layer, a third metal layer, a plurality of row driving circuits and a plurality of column driving circuits;
    wherein the second metal layer comprises a plurality of scan lines which extend horizontally, the third metal layer comprises a plurality of data lines which extend vertically and are insulated from the scan lines, the first metal layer comprises switching lines of a same number of the scan lines which extend vertically; one switching line is correspondingly coupled to one scan line, one of the row driving circuits is correspondingly coupled to a plurality of switching lines, one of the column driving circuits is correspondingly coupled to a plurality of data lines;
    wherein the active matrix organic light emitting diode display panel structure comprises a display area and a left border frame region, a right border frame region, an upper border frame region and a lower border frame region surrounding a periphery of the display area; the row driving circuits and the column driving circuits are located in the lower border frame region; the left border frame region, the right border frame region and the upper border frame region are only used for package;

wherein the first metal layer further comprises a power supply line, the second metal layer further comprises a first conductor line connecting the power supply line and the third metal layer further comprises a second conductor line connecting the first conductor line;

wherein a buffer layer is arranged between the scan line and the switching line, one scan line is electrically coupled to one switching line through a first through hole penetrating the buffer layer;

wherein thin film package is used in the left border frame region, the right border frame region and the upper border frame region;

wherein the active matrix organic light emitting diode display panel structure further comprises a substrate, a gate integrated with the scan line, a gate insulation layer, an active layer, an etching stopper layer, a source integrated with the data line and a drain located at a same layer with the data line;

wherein the switching line and the power supply line are arranged on the substrate, the buffer layer covers the substrate, the switching line and the power supply line, the scan line and the first conductor line are arranged on the buffer layer, the gate insulation layer covers the buffer layer, the scan line, the gate integrated with the scan line and the first conductor line, the active layer is arranged on the gate insulation layer, the etching stopper layer covers the active layer and the gate insulation layer, all of the data line, the source integrated with the data line, the drain and the second conductor line are arranged on the etching stopper layer;

wherein the first conductor line contacts the power supply line via a second through hole penetrating the buffer layer; the source integrated with the data line and the drain respectively contact two sides of the active layer via a third through hole and a fourth through hole penetrating the etching stopper layer; the second conductor line contacts with the first conductor line via a fifth through hole penetrating the etching stopper layer and the gate insulation layer.

11. The active matrix organic light emitting diode display panel structure according to claim 10, wherein one of the row driving circuits is individually packaged inside one row driving chip and one of the column driving circuits is individually packaged inside one column driving chip.

12. The active matrix organic light emitting diode display panel structure according to claim 10, wherein one of the row driving circuits and one of the column driving circuits are integrally packaged inside one integrated driving chip.

13. The active matrix organic light emitting diode display panel structure according to claim 10, wherein materials of the switching line, the power supply line, the scan line, the gate integrated with the scan line, the first conductor line, the data line, the source integrated with the data line, the drain and the second conductor line are a stack combination of one or more of molybdenum, titanium, aluminum and copper.

14. The active matrix organic light emitting diode display panel structure according to claim 10, wherein materials of the buffer layer, the gate insulation layer and the etching stopper layer are silicon oxide, silicon nitride or a combination of the two; the substrate is a glass substrate.

* * * * *